United States Patent
Tseng

(10) Patent No.: US 8,847,407 B2
(45) Date of Patent: *Sep. 30, 2014

(54) STRUCTURE OF OUTPUT STAGE

(75) Inventor: Wei-Kai Tseng, Tainan (TW)

(73) Assignee: Himax Technologies Limited, Tainan (TW)

(*) Notice: Subject to any disclaimer, the term of this patent is extended or adjusted under 35 U.S.C. 154(b) by 125 days.

This patent is subject to a terminal disclaimer.

(21) Appl. No.: 13/567,338

(22) Filed: Aug. 6, 2012

(65) Prior Publication Data

US 2013/0033301 A1 Feb. 7, 2013

Related U.S. Application Data

(63) Continuation-in-part of application No. 13/204,069, filed on Aug. 5, 2011, now Pat. No. 8,350,340.

(51) Int. Cl.
H01L 31/18 (2006.01)
H01L 29/40 (2006.01)
H01L 29/768 (2006.01)

(52) U.S. Cl.
CPC ........ *H01L 29/401* (2013.01); *H01L 29/76816* (2013.01)
USPC .......................................... 257/775; 257/773

(58) Field of Classification Search
USPC ................................................. 257/775, 773
See application file for complete search history.

(56) References Cited

U.S. PATENT DOCUMENTS

| | | | | |
|---|---|---|---|---|
| 3,737,743 | A * | 6/1973 | Goronkin et al. | 257/280 |
| H0842 | H * | 11/1990 | Ochs | 257/767 |
| 5,066,895 | A * | 11/1991 | Alessio | 315/226 |
| 5,258,638 | A * | 11/1993 | Elhatem et al. | 257/401 |
| 8,399,937 | B2 * | 3/2013 | Rohrer et al. | 257/401 |
| 8,624,335 | B2 * | 1/2014 | Adamski | 257/401 |
| 2002/0084530 | A1 * | 7/2002 | Park et al. | 257/775 |
| 2010/0117162 | A1 * | 5/2010 | Rohrer et al. | 257/401 |
| 2012/0139059 | A1 * | 6/2012 | Richardson et al. | 257/401 |

* cited by examiner

*Primary Examiner* — Michael Shingleton
(74) *Attorney, Agent, or Firm* — J.C. Patents

(57) ABSTRACT

A structure of an output stage, and the structure includes a first electrode, a second electrode, a third electrode, a plurality of first auxiliary electrodes, a plurality of second auxiliary electrodes, a plurality of third auxiliary electrodes, a plurality of fourth auxiliary electrodes, a first switching unit, and a second switching unit. Wherein, a plurality of first currents flow through the turned-on first switching unit, and a first flowing direction of the first currents in the turned-on first switching unit is from the first electrode to the second electrode. A plurality of second currents flow through the turned-on second switching unit, and a second flowing direction of the second currents in the turned-on second switching unit is from the second electrode to the third electrode.

7 Claims, 3 Drawing Sheets

STRUCTURE OF OUTPUT STAGE

CROSS-REFERENCE TO RELATED APPLICATION

This application is a continuation-in-part application of and claims the priority benefit of a prior application Ser. No. 13/204,069, filed on Aug. 5, 2011, now pending. The entirety of the above-mentioned patent applications is hereby incorporated by reference herein and made a part of this specification.

BACKGROUND OF THE INVENTION

1. Field of the Invention

The invention generally relates to a structure of an output stage, in particular, to a structure of an output stage capable of advancing the driving capacity for the high output current thereof.

2. Description of Related Art

Nowadays, an operational amplifier is usually applied in diverse circuits, for example, an operational amplifier is operated on the amplification of signals, or is used to drive loads such as capacitance loads, or is implemented as a feedback circuit, or etc. Hence, an operational amplifier usually has characteristics of high input impedance, high loop gain, low output impedance, low common mode gain, and high gain bandwidth for applying in any kind of circuits. Especially, it is important for an operational amplifier to operate with high driving capacity under a high current condition.

The driving capacity of an operational amplifier can be advanced by enlarging the width of an output stage of the operational amplifier. In addition, although the output stage of the operational amplifier is usually protected e.g. by an over current protect (OCP) and an over temperature protect (OTP) to limit the current of the output stage thereof, the protection circuits described above sometimes fail. Therefore, it is still necessary to optimize an operational amplifier for operating under a high current condition.

SUMMARY OF THE INVENTION

Accordingly, the present invention is directed to a structure of an output stage capable of advancing the driving capacity of the output stage for the high output current thereof.

The invention provides a structure of an output stage, which includes a first electrode, a second electrode, a third electrode, a plurality of first auxiliary electrodes, a plurality of second auxiliary electrodes, a plurality of third auxiliary electrodes, a plurality of fourth auxiliary electrodes, a first switching unit, and a second switching unit. The first auxiliary electrodes are disposed between the first electrode and the second electrode and connected to the first electrode, wherein a width of each of the first auxiliary electrodes is inversely proportional to a distance thereof from the first electrode. The second auxiliary electrodes are disposed between the first electrode and the second electrode and connected to the second electrode, wherein a width of each of the second auxiliary electrodes is inversely proportional to a distance thereof from the second electrode. The third auxiliary electrodes are disposed between the second electrode and the third electrode and connected to the second electrode, wherein a width of each of the third auxiliary electrodes is inversely proportional to a distance thereof from the second electrode. The fourth auxiliary electrodes are disposed between the second electrode and the third electrode and connected to the third electrode, wherein a width of each of the fourth auxiliary electrodes is inversely proportional to a distance thereof from the third electrode. The first auxiliary electrodes and the second auxiliary electrodes are electrically connected to each other respectively through the turned-on first switching unit; meanwhile, a plurality of first currents flows through the turned-on switching unit, and a first flowing direction of the first currents in the turned-on first switching unit is from the first electrode to the second electrode. The third auxiliary electrodes and the fourth auxiliary electrodes are electrically connected to each other respectively through the turned-on second switching unit; meanwhile, a plurality of second currents flows through the turned-on switching unit, and a second flowing direction of the second currents in the turned-on second switching unit is from the second electrode to the third electrode.

In an embodiment of the above invention, the shapes of the first auxiliary electrodes, the second auxiliary electrodes, the third auxiliary electrodes, and the fourth auxiliary electrodes are respectively a trapezoid.

In an embodiment of the above invention, the first electrode, the second electrode, and the third electrode are sequentially disposed between a power terminal and a ground terminal.

In an embodiment of the above invention, the first electrode is electrically connected to the power terminal, the second electrode is electrically connected to an output terminal, and the third electrode is electrically connected to the ground terminal.

In an embodiment of the above invention, the first switching unit comprises at least a PMOS-type transistor.

In an embodiment of the above invention, each of the PMOS-type transistors includes a plurality of first source electrodes and a plurality of first drain electrodes, and the first source electrodes and the first drain electrodes are extended from the first electrode to the second electrode.

In an embodiment of the above invention, the first source electrodes and the first drain electrodes are alternately arranged.

In an embodiment of the above invention, the second switching unit comprises at least a NMOS-type transistor.

In an embodiment of the above invention, each of the NMOS-type transistors includes a plurality of second source electrodes and a plurality of second drain electrodes, and the second source electrodes and the second drain electrodes are extended from the second electrode to the third electrode.

In an embodiment of the above invention, the second source electrodes and the second drain electrodes are alternately arranged.

In an embodiment of the above invention, the first electrode, the second electrode and third electrode are respectively a top metal layer.

Based on the description above, the first electrode and the second electrode are electrically connected to each other respectively through the turned-on first switching unit, and the second electrode and the third electrode are electrically connected to each other respectively through the turned-on second switching unit. In the turned-on first switching unit, the first flowing direction of the first currents is from the first electrode to the second electrode. In the turned on second switching unit, the second flowing direction of the second currents is from the second electrode to the third electrode. In this way, the driving capacity of the output stage is optimized.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
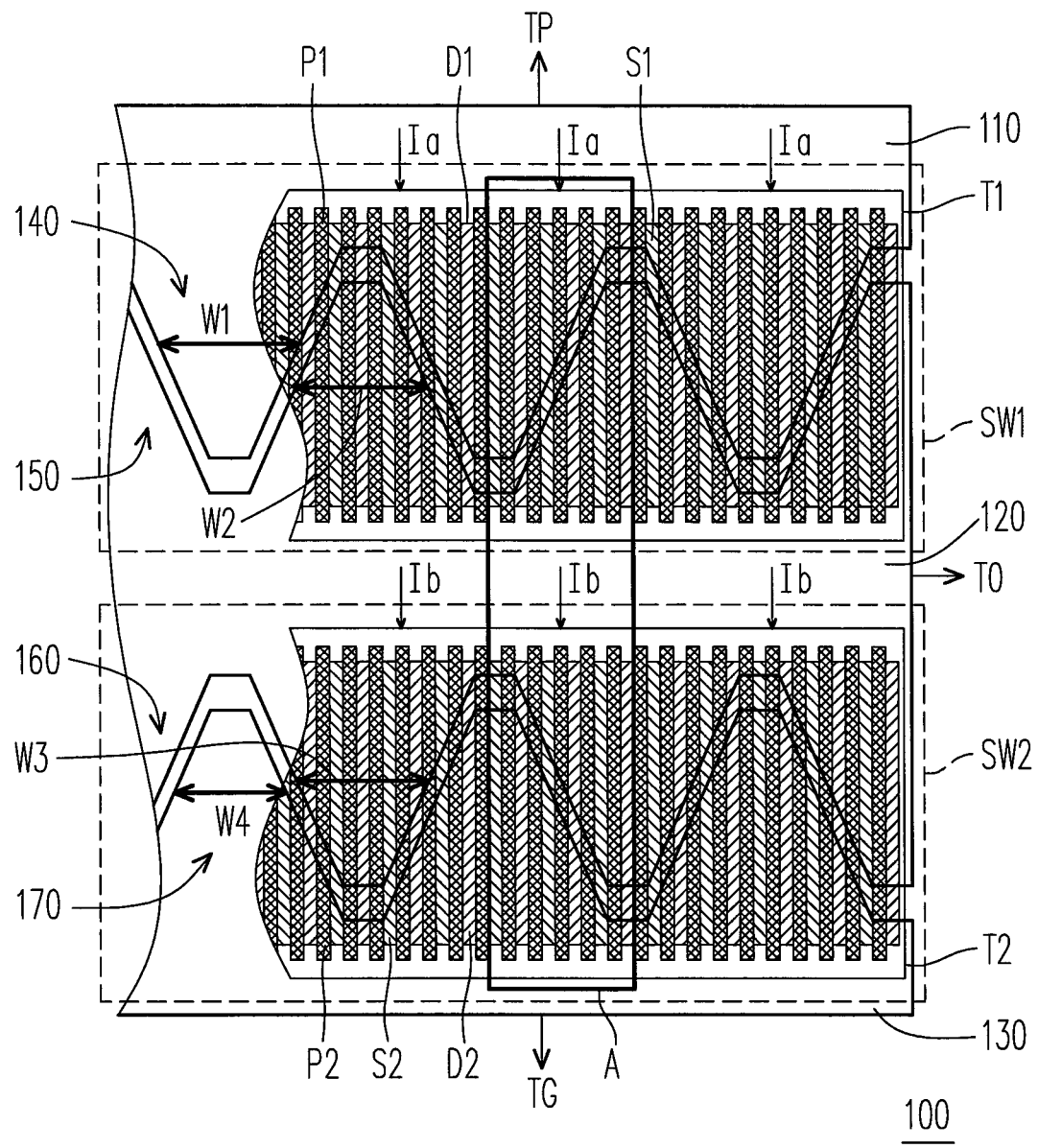
FIG. 1A shows a schematic diagram of a structure of an output stage according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1A shows a schematic diagram of a structure of an output stage according to an embodiment of the invention. Referring to FIG. 1A, in the embodiment, an output stage 100 includes a first electrode 110, a second electrode 120, a third electrode 130, a plurality of first auxiliary electrodes 140, a plurality of second auxiliary electrodes 150, a plurality of third auxiliary electrodes 160, a plurality of fourth auxiliary electrodes 170, a first switching unit SW1 and a second switching unit SW2. The first electrode 110, the second electrode 120, and the third electrode 130 herein are sequentially in parallel disposed between a power terminal TP and a ground terminal TG, the first electrode 110 is electrically connected to the power terminal TP, the second electrode 120 is electrically connected to an output terminal TO and the third electrode 130 is electrically connected to the ground terminal TG, in which the power terminal TP, the output terminal TO and the ground terminal TG can be a power terminal, an output terminal and a ground terminal of a chip.

In detail, the first auxiliary electrodes 140 and the second auxiliary electrodes 150 are disposed between the first electrode 110 and the second electrode 120, the first auxiliary electrodes 140 are connected to the first electrode 110, the second auxiliary electrodes 150 are connected to the second electrode 120, and the first auxiliary electrodes 140 are indirectly connected to the second auxiliary electrodes 150. Herein, the width W1 of each of the first auxiliary electrodes 140 is inversely proportional to the distance thereof from the first electrode 110, i.e., the closer to the first electrode 110, the wider the width W1 of each of the first auxiliary electrodes 140 is and the farther to the first electrode 110, the narrower the width W1 of each of the first auxiliary electrodes 140 is; the width W2 of each of the second auxiliary electrodes 150 is inversely proportional to the distance thereof from the second electrode 120, i.e., the closer to the second electrode 120, the wider the width W2 of each of the second auxiliary electrodes 150 is and the farther to the second electrode 120, the narrower the width W2 of each of the second auxiliary electrodes 150 is. In the embodiment, the shapes of the first auxiliary electrodes 140 and the second auxiliary electrodes 150 are in trapezoid, which the other embodiments of the invention are not limited to.

The third auxiliary electrodes 160 and the fourth auxiliary electrodes 170 are disposed between the second electrode 120 and the third electrode 130, the third auxiliary electrodes 160 are connected to the second electrode 120, the fourth auxiliary electrodes 170 are connected to the third electrode 130, and the third auxiliary electrodes 160 are indirectly connected to the fourth auxiliary electrodes 170. Herein, the width W3 of each of the third auxiliary electrodes 160 is inversely proportional to the distance thereof from the second electrode 120, i.e., the closer to the second electrode 120, the wider the width W3 of each of the third auxiliary electrodes 160 is and the farther to the second electrode 120, the narrower the width W3 of each of the third auxiliary electrodes 160 is; the width W4 of each of the fourth auxiliary electrodes 170 is inversely proportional to the distance thereof from the third electrode 130, i.e., the closer to the third electrode 130, the wider the width W4 of each of the fourth auxiliary electrodes 170 is and the farther to the third electrode 130, the narrower the width W4 of each of the fourth auxiliary electrodes 170 is. In the embodiment, the shapes of the third auxiliary electrodes 160 and the fourth auxiliary electrodes 170 are in trapezoid, which the other embodiments of the invention are not limited to.

The first switching unit SW1 is disposed overlapping the first electrodes 110 and the second electrode 120, and the second switching unit SW2 is disposed overlapping the second electrode 120 and the third electrode 130. When the first switching unit SW1 is turned on, a plurality of currents (e.g. the currents Ia) of the first electrode 110 and the first auxiliary electrodes 140 are transferred to the second electrode 120 and the second auxiliary electrodes 150 via the turned on first switching unit SW1. Likewise, when the second switching unit SW2 is turned on, a plurality of currents (e.g. the currents Ib) of the second electrode 120 and the third auxiliary electrodes 160 are transferred to the third electrode 130 and the fourth auxiliary electrodes 170 via the turned on second switching unit SW2.

In this embodiment, the switching units SW1 and SW2 include one first transistor T1 and one second transistor T2 respectively. In another embodiment, the switching units SW1 and SW2 can include a plurality of first transistors T1 and a plurality of second transistors T2 respectively. Moreover, the area of the first transistor T1 is disposed to cover all the first auxiliary electrodes 140 and the second auxiliary electrodes 150, and the area of the second transistor T2 is disposed to cover all the third auxiliary electrodes 160 and the fourth auxiliary electrodes 170. The first transistor T1 is e.g. a PMOS-type transistor, and the second transistor T2 is e.g. a NMOS-type transistor.

The first transistor T1 includes a plurality of first source electrodes S1, first drain electrodes D1, and channel layers P1; besides, the first source electrodes S1, the first drain electrodes D1 and channel layers P1 are extended from the first electrode 110 to the second electrode 120, i.e. the disposing direction of each of first source electrodes S1, first drain electrodes D1, and channel layers P1 is from the first electrode 110 to the second electrode 120. Likewise, the second transistor T2 includes a plurality of second source electrodes S2, second drain electrodes D2, and channel layers P2; besides, the second source electrodes S2, the second drain electrodes D2 and channel layers P2 are extended from the second electrode 120 to the third electrode 130, i.e. the disposing direction of each of first source electrodes S1, first drain electrodes D1, and channel layers P1 is from the first electrode 110 to the second electrode 120. In addition, the first source electrodes S1 and the first drain electrodes D1 are alternately arranged along a horizontal direction based on the FIG. 1A, and the second source electrodes S2 and the second drain electrodes D2 are alternately arranged along the horizontal direction based on the FIG. 1A.

In other words, the first source electrodes S1, the first drain electrodes D1 and channel layers P1 of the first transistors T1 are formed of rectangularity between the first electrode 110 and the second electrode 120; then, one terminal of each of the first source electrodes S1, the first drain electrodes D1 and channel layers P1 is disposed overlapping the first electrode 110, and the other terminal of each of the first source electrodes S1, the first drain electrodes D1 and channel layers P1 is disposed overlapping to the second electrode 120. Likewise, the second source electrodes S2, the second drain electrodes D2 and channel layers P2 of the second transistor T2 are formed of rectangularity between the second electrode 120 and the third electrode 130; in addition, one terminal of each of the second source electrodes S2, the second drain electrodes D2 and channel layers P2 is disposed overlapping the second electrode 120, and the other terminal of each of the second source electrodes S2, the second drain electrodes D2 and channel layers P2 is disposed overlapping the third electrode 130.

Figure 1B:
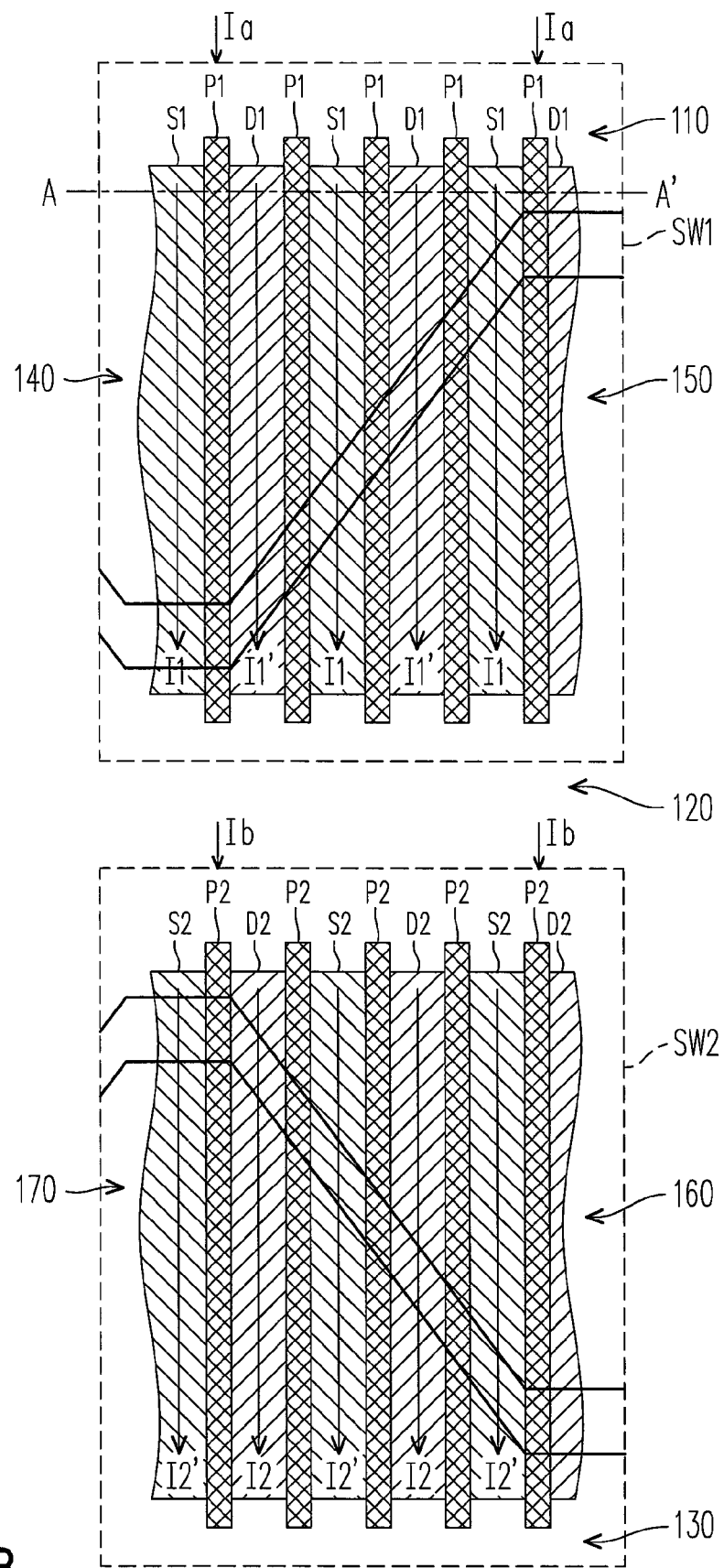
FIG. 1B is an enlarged schematic diagram of the A-portion in the structure of FIG. 1A according to an embodiment of the invention.

FIG. 1B is an enlarged schematic diagram of the A-portion in the structure of FIG. 1A. Referring to FIG. 1B, the first source electrodes 51 are electrically connected to the first electrode 110 and the first auxiliary electrodes 140 directly, the first drain electrodes D1 are electrically connected to the second electrode 120 and second auxiliary electrodes 150 directly. The currents Ia are gradually flowing into the first source electrodes S1 of the first transistor T1 and become the first currents I1. When the first transistor T1 is turned on, the first currents I1 of the first source electrodes S1 are flowing to the first drain electrodes D1 via channels created by the channel layers P1 and become the first currents I1', wherein the first currents I1 and I1' are substantially equal. Herein, a first flowing direction of each of the first currents I1 and I1' in the first source electrodes S1 and the first drain electrodes D1 of the turned-on first transistor T1 (i.e. the turned-on first switching unit SW1) is from the first electrode 110 to the second electrode 120. Afterwards, the first currents I1' are gradually flowing into the second electrode 120 and the second auxiliary electrodes 150.

Since the currents Ia of the first electrode 110 and the first auxiliary electrodes 140 are gradually flowing into the first source electrodes S1, the closer to the first electrode 110, the higher the current density of each of the first auxiliary electrodes 140 is, and the farther from the first electrode 110, the lower the current density of each of the first auxiliary electrodes 140 is. Therefore, the width W1 of each of the first auxiliary electrodes 140 is inversely proportional to the distance thereof from the first electrode 110 while the first source electrodes S1 derive the currents Ia from the first auxiliary electrodes 140 gradually depending on the distance thereof from the first electrode 110. Thus, the current density of each of the first auxiliary electrodes 140 is enhanced.

Likewise, since the first currents I1' of the first drain electrode D1 are gradually flowing into second auxiliary electrodes 150 and the second electrode 120, the closer to the second electrode 120, the higher the current density of each of the second auxiliary electrodes 150 is, and the farther from the second electrode 120, the lower the current density of each of the second auxiliary electrodes 150 is. Therefore, the width W2 of each of the second auxiliary electrodes 150 is inversely proportional to the distance thereof from the second electrode 120 while the first currents I1' of the first drain electrodes D1 are flowing into the second auxiliary electrodes 150 gradually depending on the distance thereof from the second electrode 120. In this way, the current density of each of the second auxiliary electrodes 150 is enhanced.

Similarly, the second drain electrodes D2 are electrically connected to the second electrode 120 and third auxiliary electrodes 160 directly, the second source electrodes S2 are electrically connected to the third electrode 130 and forth auxiliary electrodes 170 directly. The currents Ib are gradually flowing into the second drain electrodes D2 of the second transistor T2 and become the second currents I2. When the second transistor T2 is turned on, the second currents I2 of the second drain electrodes D2 are flowing to the second source electrodes S2 via channels created by the channel layers P2 and become the second currents I2', wherein the first currents I2 and I2' are substantially equal. Herein, a second flowing direction of each of the second currents I2 and I2' in the second drain electrodes D2 and the second source electrodes S2 of the turned-on second transistor T2 (i.e. the turned-on second switching unit SW2) is from the second electrode 120 to the third electrode 130. Afterwards, the second currents I2' are gradually flowing into the third electrode 130 and the fourth auxiliary electrodes 170.

Since the currents Ib of the second electrode 120 and the third auxiliary electrodes 160 are gradually flowing into the second drain electrodes D2, the closer to the second electrode 120, the higher the current density of each of the third auxiliary electrodes 160 is, and the farther from the second electrode 120, the lower the current density of each of the third auxiliary electrodes 160 is. Therefore, the width W3 of each of the third auxiliary electrodes 160 is inversely proportional to the distance thereof from the second electrode 120 while the second drain electrodes D2 derive the currents Ib from the third auxiliary electrodes 160 gradually depending on the distance thereof from the second electrode 120. Thus, the current density of each of the third auxiliary electrodes 160 is enhanced.

Likewise, since the second currents I2' of the second source electrode S2 are gradually flowing into the fourth auxiliary electrodes 170 and the third electrode 130, the closer to the third electrode 130, the higher the current density of each of the fourth auxiliary electrodes 170 is, and the farther from the second electrode 120, the lower the current density of each of the fourth auxiliary electrodes 170 is. Therefore, the width W4 of each of the fourth auxiliary electrodes 170 is inversely proportional to the distance thereof from the third electrode 130 while the second currents I2' of the second source electrodes S2 are flowing into the fourth auxiliary electrodes 170 gradually depending on the distance thereof from the third electrode 130. In this way, the current density of each of the fourth auxiliary electrodes 170 is enhanced.

Figure 1C:
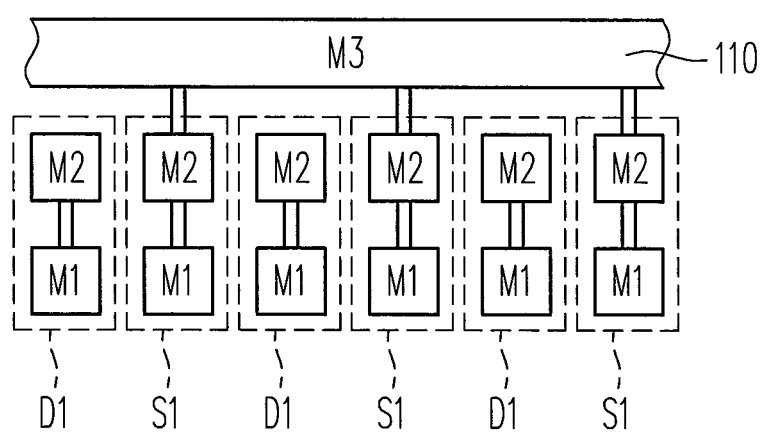
FIG. 1C is a cross section view of FIG. 1B along the intercepting line AA' according to an embodiment of the invention.

FIG. 1C is a cross section view of FIG. 1B along the intercepting line AA' according to an embodiment of the invention. Referring to the FIG. 1B and 1C, in the embodiment, each of the first source electrodes S1 and the first drain electrodes D1 includes a metal layer M1 and a metal layer M2, the first electrode 110 includes a metal layer M3, wherein the metal layer M3 is a top metal layer. Similarly, the second electrode 120 and third electrode 130 can respectively include a metal layer M3 which is a top metal layer. Herein, the metal layers M1 and M2 of the first source electrodes S1 are electrically connected to the metal layer M3 of the first electrode 110 so that the metal layers M1 and M2 (i.e. the first source electrodes S1) can help the metal layer M3 (i.e. the first electrode 110) to transfer currents and the current density of the first electrode 110 is enhanced.

Likewise, the first source electrodes S1 can help the first auxiliary electrodes 140 to transfer currents so that the current density of each of the first auxiliary electrodes 140 is enhanced; the first drain electrodes D1 can help the second auxiliary electrodes 150 and the second electrode 120 to transfer currents so that the current density of each of the second auxiliary electrodes 150 and the second electrode 120 is enhanced; the second drain electrodes D2 can help the third auxiliary electrodes 160 and the second electrode 120 to transfer currents so that the current density of each of the third auxiliary electrodes 160 and the second electrode 120 is enhanced; and, the second source electrodes S2 can help the fourth auxiliary electrodes 170 and the third electrode 130 to transfer currents so that the current density of each of the fourth auxiliary electrodes 170 and the third electrode 130 is enhanced.

In summary, in the output stage of the embodiments of the invention, the width variations of the auxiliary electrodes can be set according to the current density distributions of the auxiliary electrodes so that the currents flowing through the auxiliary electrodes get maximized to optimize the driving capacity of the output stage. Moreover, the source and drain electrodes of each of the switching units are extended from one electrode to another electrode so that the flowing direction of currents in the switching units is the direction from the first electrode to the third electrode. In this way, the current densities of the first electrode, the second electrode, the third electrode, the first auxiliary electrodes, the second auxiliary electrodes, the third auxiliary electrodes, and the fourth auxiliary electrodes are enhanced. The first electrode, the second electrode and third electrode can be top metal layers.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A structure of an output stage, comprising:
    a first electrode;
    a second electrode;
    a third electrode;
    a plurality of first auxiliary electrodes, disposed between the first electrode and the second electrode and connected to the first electrode, wherein a width of each of the first auxiliary electrodes is inversely proportional to a distance thereof from the first electrode;
    a plurality of second auxiliary electrodes, disposed between the first electrode and the second electrode and connected to the second electrode, wherein a width of each of the second auxiliary electrodes is inversely proportional to a distance thereof from the second electrode;
    a plurality of third auxiliary electrodes, disposed between the second electrode and the third electrode and connected to the second electrode, wherein a width of each of the third auxiliary electrodes is inversely proportional to a distance thereof from the second electrode;
    a plurality of fourth auxiliary electrodes, disposed between the second electrode and the third electrode and connected to the third electrode, wherein a width of each of the fourth auxiliary electrodes is inversely proportional to a distance thereof from the third electrode;
    a first switching unit, wherein the first auxiliary electrodes and the second auxiliary electrodes are electrically connected to each other respectively through the turned-on first switching unit; meanwhile, wherein a plurality of first currents flow through the turned-on first switching unit, and a first flowing direction of the first currents in the turned-on first switching unit is from the first electrode to the second electrode, wherein the first switching unit comprises at least a PMOS-type transistor, each of the PMOS-type transistors comprises a plurality of first source electrodes and a plurality of first drain electrodes, the first source electrodes and the first drain electrodes are extended beyond the corresponding first auxiliary electrode and the corresponding second auxiliary electrode from the first electrode to the second electrode, the first source electrodes are connected to the first electrode, the first drain electrodes are connected to the second electrode, each of first auxiliary electrode is connected to the corresponding first source electrodes, and each of second auxiliary electrode is connected to the corresponding first drain electrodes; and
    a second switching unit, wherein the third auxiliary electrodes and the fourth auxiliary electrodes are electrically connected to each other respectively through the turned-on second switching unit; meanwhile, wherein a plurality of second currents flow through the turned-on switching unit, and a second flowing direction of the second currents in the turned-on second switching unit is from the second electrode to the third electrode, wherein the second switching unit comprises at least a NMOS-type transistor, each of the NMOS-type transistors comprises a plurality of second source electrodes and a plurality of second drain electrodes, the second source electrodes and the second drain electrodes are extended beyond the corresponding third auxiliary electrode and the corresponding fourth auxiliary electrode from the second electrode to the third electrode, the second drain electrodes are connected to the second electrode, the second source electrodes are connected to the third electrode, each of third auxiliary electrode is connected to the corresponding second drain electrodes, and each of fourth auxiliary electrode is connected to the corresponding second source electrodes.

2. The structure of an output stage as claimed in claim 1, wherein the shapes of the first auxiliary electrodes, the second auxiliary electrodes, the third auxiliary electrodes and the fourth auxiliary electrodes are respectively a trapezoid.

3. The structure of an output stage as claimed in claim 1, wherein the first electrode, the second electrode and the third electrode are sequentially disposed between a power terminal and a ground terminal.

4. The structure of an output stage as claimed in claim 3, wherein the first electrode is electrically connected to the power terminal, the second electrode is electrically connected to an output terminal and the third electrode is electrically connected to the ground terminal.

5. The structure of an output stage as claimed in claim 1, wherein the first source electrodes and the first drain electrodes are alternately arranged.

6. The structure of an output stage as claimed in claim 1, wherein the second source electrodes and the second drain electrodes are alternately arranged.

7. The structure of an output stage as claimed in claim 1, wherein the first electrode, the second electrode and third electrode are respectively a top metal layer.

* * * * *